United States Patent
Gowda et al.

(10) Patent No.: US 12,550,736 B2
(45) Date of Patent: *Feb. 10, 2026

(54) PACKAGING ARCHITECTURE WITH REINFORCEMENT STRUCTURE IN PACKAGE SUBSTRATE

(71) Applicant: Intel Corporation, Santa Clara, CA (US)

(72) Inventors: Mohan Prashanth Javare Gowda, Ottobrunn (DE); Stephan Stoeckl, Schwandorf (DE); Sonja Koller, Bavaria (DE); Wolfgang Molzer, Ottobrunn (DE); Thomas Wagner, Regelsbach (DE); Pouya Talebbeydokhti, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 822 days.

This patent is subject to a terminal disclaimer.

(21) Appl. No.: 17/679,189

(22) Filed: Feb. 24, 2022

(65) Prior Publication Data

US 2023/0268291 A1  Aug. 24, 2023

(51) Int. Cl.
*H01L 23/00* (2006.01)
*H01L 23/498* (2006.01)
*H01L 23/552* (2006.01)

(52) U.S. Cl.
CPC ...... *H01L 23/562* (2013.01); *H01L 23/49822* (2013.01); *H01L 23/49827* (2013.01); *H01L 23/49866* (2013.01); *H01L 23/552* (2013.01)

(58) Field of Classification Search
CPC ............ H01L 23/562; H01L 23/49822; H01L 23/49827; H01L 23/49866; H01L 23/552; H01L 23/49838; H01L 23/3128; H01L 23/49816; H01L 23/5385
See application file for complete search history.

(56) References Cited

U.S. PATENT DOCUMENTS

| | | | |
|---|---|---|---|
| 2017/0303392 A1* | 10/2017 | Naigertsik | ............. H05K 7/207 |
| 2020/0091128 A1* | 3/2020 | Elsherbini | ........... H01L 23/5386 |
| 2021/0111147 A1* | 4/2021 | Liff | ......................... H01L 24/24 |
| 2021/0111166 A1* | 4/2021 | Zhang | ............... H01L 23/49822 |
| 2022/0115350 A1* | 4/2022 | Mun | ..................... H01L 21/561 |
| 2023/0268286 A1* | 8/2023 | Gowda | ................. H01L 23/552 |
| | | | 257/668 |

* cited by examiner

*Primary Examiner* — Teresa M. Arroyo
(74) *Attorney, Agent, or Firm* — Akona IP PC

(57) ABSTRACT

Embodiments of a microelectronic assembly include a package substrate comprising: a first layer comprising a first plurality of mutually parallel channels of a first material; a second layer comprising columns of the first material; and a third layer comprising a second plurality of mutually parallel channels of the first material, the second plurality of mutually parallel channels being orthogonal to the first plurality of mutually parallel channels. The second layer is between the first layer and the third layer, at least some columns extend between and contact the first plurality of mutually parallel channels and the second plurality of mutually parallel channels, and at least a portion of the first layer, the second layer and the third layer comprises a second material different from the first material.

16 Claims, 9 Drawing Sheets

PACKAGING ARCHITECTURE WITH REINFORCEMENT STRUCTURE IN PACKAGE SUBSTRATE

TECHNICAL FIELD

The present disclosure relates to techniques, methods, and apparatus directed to a packaging architecture with reinforcement structure in package substrate.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
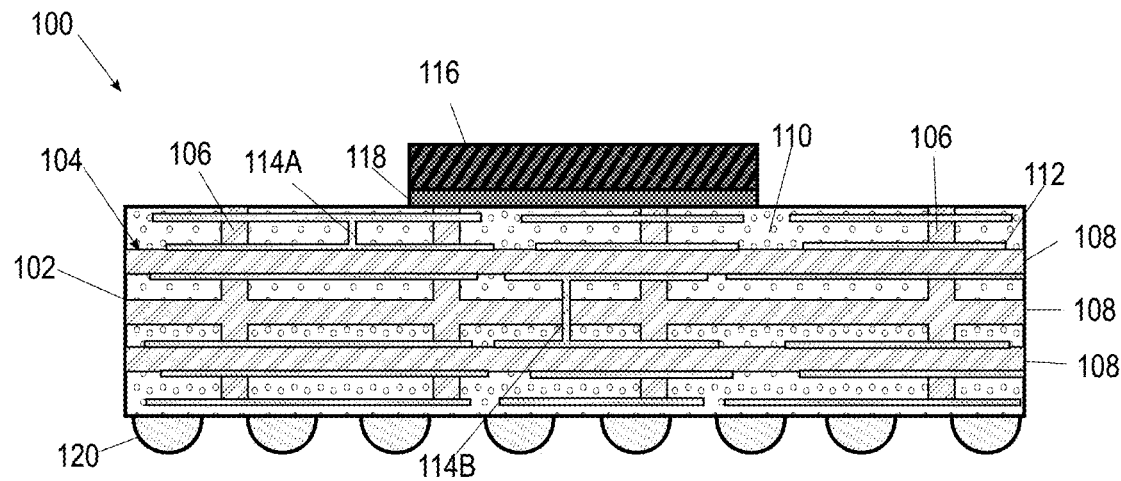
FIG. 1 is a simplified cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

The need for improved performance and miniaturization drive improvements in advanced packaging concepts such as system-in-package (SiP), 2.XD, 3D etc. With such increasingly complex packages, multiple other challenges need to be addressed. One such challenge is warpage arising out of mismatch in coefficient of thermal expansion (CTE) between the different materials used in the package. As used herein, CTE is defined as the rate of change of a linear dimension for every unit change of temperature; for orthotropic materials having different CTEs in different directions, the CTE may be an effective (e.g., average) value accounting for all three orthogonal directions. An example of CTE mismatch is an IC die made of silicon having a lower CTE (e.g., CTE of 2-3 ppm/° C.) than polyimide (e.g., CTE of 55 ppm/° C.) used in a package substrate of a package. During operation (or testing, such as reliability testing), the package undergoes varying temperatures (e.g., due to localized heating of the IC die, environmental temperatures, etc.), leading to different thermal expansions (and contractions) between the IC die and the package substrate; however, because the IC die is bonded to the package substrate (thereby requiring the bonded region to expand or contract together), this differential expansion (or contraction) between the materials can be accommodated by the package only by warping and stresses in the interconnects (and/or distributed in the package substrate around the IC die).

Existing solutions to reduce the warpage depending on the package type and other constraints include: using a stiffener ring, lids, integrated heat spreader (IHS) of specific size on the top side of the substrates (e.g., to increase the stiffness of the package); using a thick core in the package substrate (e.g., to increase bending stiffness of the package substrate and reduce warpage); increasing copper layer count (e.g., to change the effective CTE of the package substrate and/or to increase stiffness and/or flexibility); adjusting the chip thicknesses (e.g., to increase or decrease the bending stiffness of the IC die as appropriate); and selecting particular materials to reduce the CTE mismatch. However, such solutions have several disadvantages, for example, limited control of warpage due to limited selection of available materials with suitable CTE and/or other appropriate mechanical properties (e.g., elastic modulus); additional cost of materials and added process steps; and thicker core and additional layer counts that add to the cost and process lead time, and also increases total package height, limiting certain applications of the package.

In this regard, some embodiments of the present disclosure alleviate such problems by providing a package substrate comprising: a plurality of layers of a dielectric material; routing layers comprising conductive traces in the plurality of layers; and a reinforcement structure comprising columns extending through the plurality of layers and the routing layers, and made of a flexible material having a lower elastic modulus than the dielectric material. As used herein, the term "elastic modulus" refers to the ratio of the stress experienced by a body under external or internal forces to the resultant strain and is a measure of the resistance offered by the body to deformation. For materials having a linear relationship between stress and strain, the elastic modulus is the slope of the material's stress-strain curve. In general, a stiff material has a higher elastic modulus than a flexible material.

In some other embodiments, for example, depending on the chip-package configuration, the reinforcement structure further comprises flexible channels contacting, and coupled to, the columns, the channels having alternating perpendicularity in each layer of the dielectric material. The flexible reinforcement structures inside the package substrate can dampen and absorb any deflections (e.g., warpage, deformation, etc.). In some embodiments, the package substrate's core layer, which is typically occupied by a relatively stiff core material, can be replaced with different filling patterns of the flexible structures in the dielectric material. In various embodiments, the size, shape and profile of the flexible channels and columns may be customizable depending on the degree of flexibility needed for specific chip-package configuration and various manufacturing constraints.

In some other embodiments, the package substrate comprises routing layers comprising conductive traces in a dielectric material; and a reinforcement structure comprising channels and columns of a rigid material. The channels and the columns are arranged in alternating layers, with each routing layer between two alternating layers of channels. The rigid material has a higher elastic modulus than the dielectric material. The reinforcement structure increases the overall stiffness of the package substrate and resists any deflection resulting from CTE mismatch between the IC die and the package substrate. In various embodiments, the channels of the reinforcement structures are orthogonally oriented and alternating in each channel layer. Such an arrangement can increase bending stiffness in two orthogonal planar directions of the package substrate, thereby resisting deflection in the third orthogonal out-of-plane direction. These orthogonally oriented structures may be connected by the columns running through the thickness of the package substrate.

In various embodiments, the dimensions (e.g., width, thickness) of the reinforcement structure may be customizable based on the bending stiffness required for a specific chip-package configuration. Also, the spacing of the channels and the columns in all three dimensions can be customized to conform to design and routing requirements of the package substrate. The thickness of the channels may be in a range similar to that of the thickness of the dielectric material (e.g., prepreg) of the package substrate. The thickness of the columns may be comparable to the thickness of the core in the package substrate. The cross-sections of the reinforcement structures may be circular, rectangular, or square, or any suitable combination thereof according to manufacturability. In some embodiments, portions of the reinforcement structure may be electrically connected, for example, for electromagnetic shielding.

Embodiments as described herein can solve warpage concerns with advanced packages, enhance package reliability, permit ease of assembly handling, and improve lifetime performance of microelectronic assemblies. With improved warpage control, both first-level interconnect reliability and second-level interconnect reliability may be increased. Further, the risk for chip cracks and die-to-die interconnect failures may also be reduced in multi-chip packages. External stiffeners can be eliminated by use of the reinforcement structures as described herein, thereby reducing overall cost of packaging in some cases.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
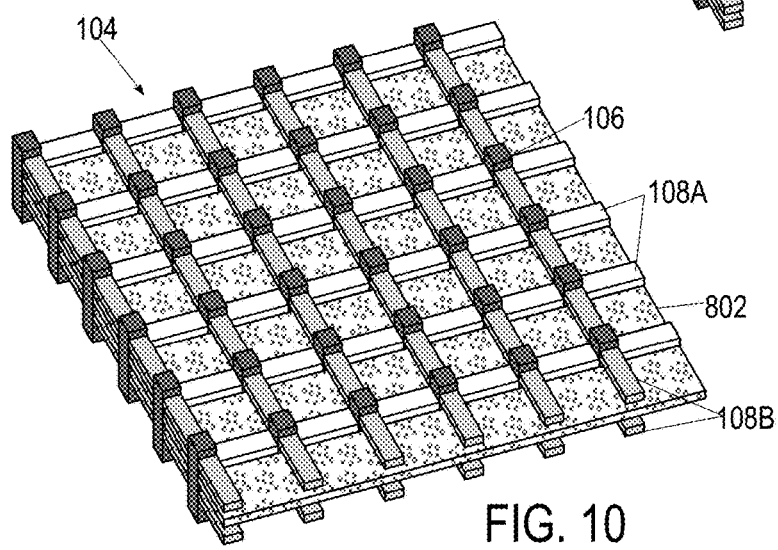
FIG. 10 is a simplified perspective view of details of an example reinforcement structure in some embodiments of the microelectronic assembly.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a simplified cross-sectional view of a microelectronic assembly 100 according to some embodiments of the present disclosure. Microelectronic assembly 100 comprises a package substrate 102 comprising a reinforcement structure 104. Reinforcement structure 104 includes columns 106 and channels 108 in a dielectric material 110 of package substrate 102. Conductive traces 112 and conductive vias 114 (e.g., 114A, 114B) may be disposed in dielectric material 110. An IC die 116 may be coupled to package substrate 102 by interconnects 118 on one side; on an opposing side, package substrate 102 may be coupled to a PCB (not shown) by interconnects 120. In various embodiments, interconnects 118 comprise DTPS interconnects (individual interconnections are not shown separately for ease of illustration). Interconnects 120 may comprise solder balls (e.g., as shown, arranged in a ball grid array), or pins (e.g., pin grid array), or other suitable package substrate to PCB interconnections.

In various embodiments, channels 108 of reinforcement structure 104 may be arranged in layers, stacked one over the other, alternating with columns 106 that extend through a thickness of package substrate 102. Conductive traces 112 may also be disposed in a plurality of layers. Dielectric material 110 may be contained in the various layers and additional layers as appropriate. Some conductive vias 114A may couple conductive traces 112 disposed in two different layers by providing an electrical connection through dielectric material 110; some other conductive vias 114B may couple conductive traces 112 disposed in two different layers by providing an electrical connection through reinforcement structure 104, for example, through channels 108.

In various embodiments, columns 106 may be located with greater density closer to IC die 116 than farther therefrom. In other words, the pitch of columns 106 proximate to IC die 116 may be greater than the pitch of columns 106 farther from IC die 116. In other embodiments, columns 106 may distributed uniformly across package substrate 102. In yet other embodiments, the locations of columns 106 may be based on routing of conductive traces 112 and location of conductive vias 114; for example, columns 106 may not be located in a space that is occupied by conductive traces 112 or conductive vias 114. In other embodiments, conductive traces 112 and conductive vias 114 may be located (e.g., routed, placed, disposed, arranged, etc.) around columns 106 (i.e., columns 106 may be in fixed, predetermined locations, and conductive traces 112 and conductive vias 114 may be arranged so as not to intersect these locations).

In various embodiments, dielectric material 110 may comprise B-staged prepreg (e.g., prepreg is a reinforcement sheets (tows, woven, or unidirectional) pre-impregnated with partially cured (e.g., catalyzed resin) matrix) including epoxy resin; polyimide resin; polyester resin; bismaleimide triazine (BT) resin; and ABF consisting of polyethylene terephthalate (PET) support film, a resin layer, and a cover film. The reinforcement sheets of the prepreg may include fiberglass, carbon fiber, polyaramid (Kevlar), or other similar materials. The impregnating polymer resins of the prepreg may comprise thermoplastic and/or thermosets in various embodiments, built up in separate layers as appropriate and based on particular needs.

Reinforcement structure 104 may comprise a dielectric material in some embodiments, different from dielectric material 110. In embodiments where reinforcement structure 104 is intended to be flexible, such materials for reinforcement structure 104 may include materials with lower CTE and lower elastic modulus than dielectric material 110. Examples include glob top silicone, epoxy, acrylates, and sodium acetate. Glob top epoxies include one component epoxies (e.g., heat-cured epoxies), two component epoxies (e.g., room temperature cured epoxies) and ultra-violet (UV) curing epoxy materials, with fillers (e.g., thermally conductive aluminum oxide) as appropriate.

In embodiments where reinforcement structure 104 is intended to be rigid, materials for reinforcement structure 104 may be chosen to have lower CTE and higher modulus than dielectric material 110. Examples of such materials include stiffener materials (e.g., ceramic, rigid polymeric material, and metal such as copper, aluminum, steel, platinum, titanium) or core materials (e.g., fiber-reinforced epoxy). Glass fiber or glass ceramic combinations with low or even negative CTE, and higher elastic modulus than dielectric material 110 may also be used. Other examples include amorphous metal alloys (e.g., titanium, zirconium, palladium, platinum, nickel). In embodiments where reinforcement structure 104 comprises conductive material, conductive vias 114 and conductive traces 112 may be isolated therefrom to avoid electrical shorts. In other embodiments, conductive materials for reinforcement structure 104 may permit other functionalities, such as electromagnetic shielding when coupled to ground, for instance.

Figure 2:
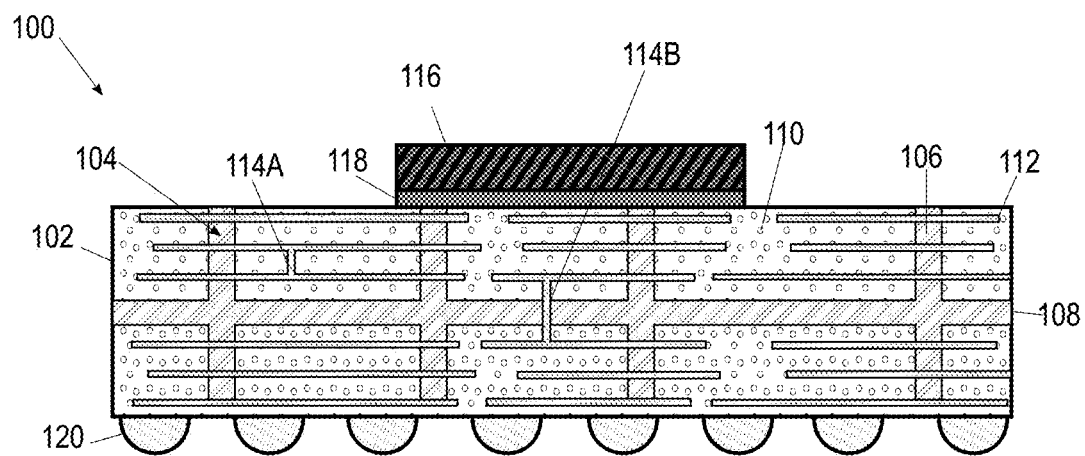
FIG. 2 is a simplified cross-sectional view of another example microelectronic assembly according to some embodiments of the present disclosure.

FIG. 2 is a simplified cross-sectional view of another example embodiment of microelectronic assembly 100. Reinforcement structure 104 may comprise channels 108 only in the medial portion of package substrate 102, in a location typically occupied by the core. In such embodiments, package substrate 102 may comprise a plurality of layers of dielectric material 110, routing layers comprising conductive traces 112 in the plurality of layers, and reinforcement structure 104 comprising columns 106 extending through the plurality of layers and the routing layers. In some embodiments, columns 106 may be more numerous (and/or densely packed) in a region of package substrate 102 proximate to bond pads (e.g., corresponding to interconnects 118 for coupling to IC die 116) than in another region of package substrate 102. In other embodiments, columns 106 may be uniformly distributed across package substrate 102.

Figure 3:
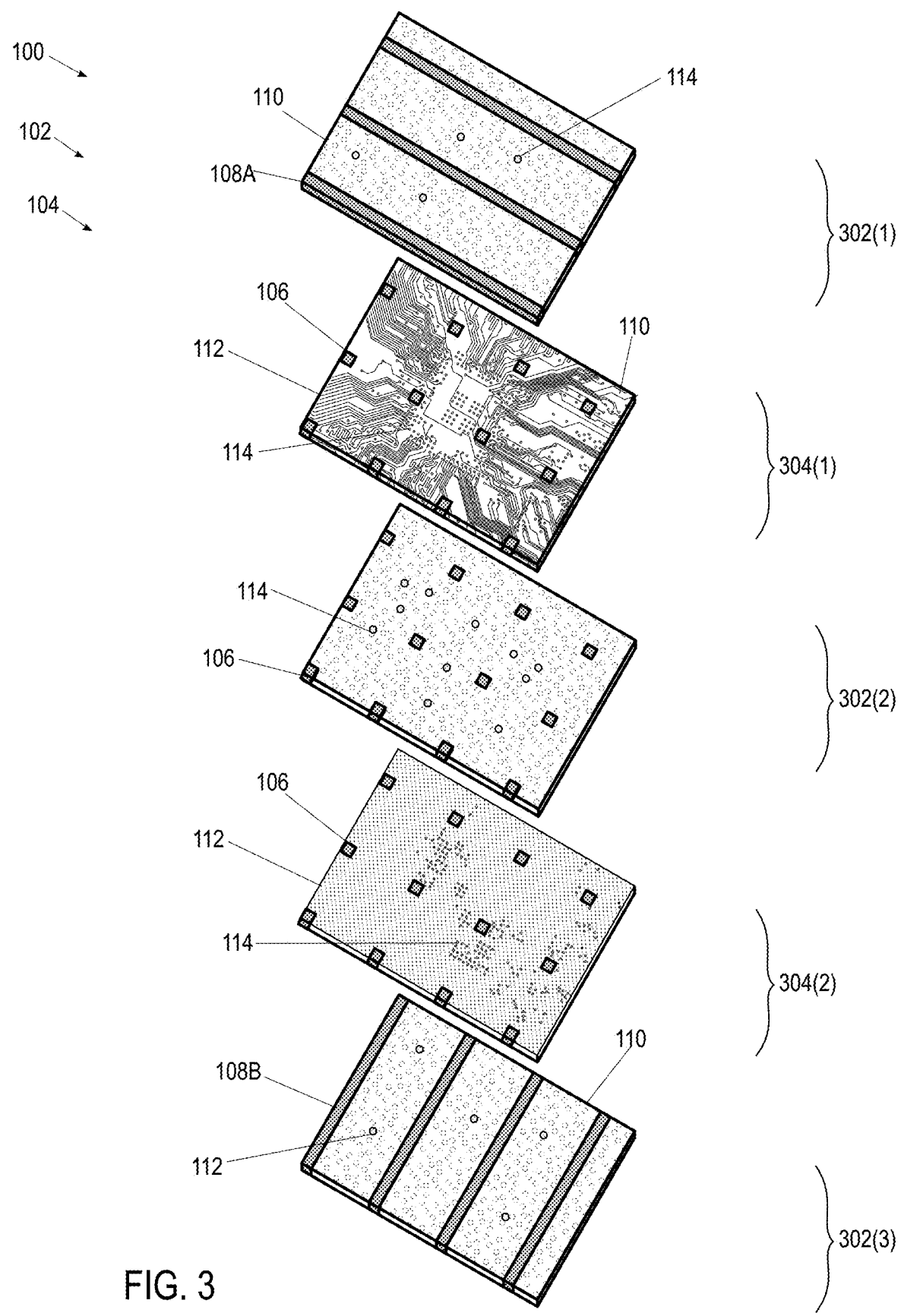
FIG. 3 is an exploded perspective view of a portion of yet another example microelectronic assembly according to some embodiments of the present disclosure.

FIG. 3 is an exploded perspective view of a portion of yet another example microelectronic assembly 100 according to some embodiments of the present disclosure. Package substrate 102 and reinforcement structure 104 may comprise a plurality of layers. For example, layer 302 may comprise channels 108 and/or columns 106 of reinforcement structure 104 and layer 304 may comprise a routing layer (also referred to as "routing layer 304") with conductive traces 112. Some routing layers 304 (e.g., 304(1)) may comprise signal traces and other routing layers 304 (e.g., 304(2)) may comprise power or ground planes. In the example embodiment shown, three layers 302, namely 302(1), 302(2), and 302(3) are shown, and two routing layers 304, namely 304(1) and 304(2) are shown, merely for illustrative purposes and not as a limitation. Package substrate 102 and reinforcement structure 104 may comprise any number of layers 302; likewise, any number of routing layers 304 may be provisioned in package substrate 102 within the broad scope of the embodiments.

In terms of material systems in microelectronic assembly 100, package substrate 102 may comprise a first plurality of layers of dielectric material 110, and reinforcement structure 104 may comprise a second plurality of layers including channels 108 and columns 106 of a different material (e.g., flexible material, or rigid material, different from dielectric material 110). Thus, layers 302 may comprise a combination of the first plurality of layers of dielectric material 110 intermixed with the second plurality of layers of a different material. Note that one or more routing layers 304 may comprise dielectric material 110 between conductive traces 112. Thus, routing layers 304 may comprise layers of dielectric material 110 intermixed with layers of conductive material (e.g., copper) of conductive traces 112, as also the different material of columns 106 that pierce through routing layers 304.

In the example shown, columns 106 and channels 108 are arranged in alternating layers (e.g., channels 108A in layer 302(1) and columns 106 in layer 302(2); channels 108B in layer 302(3) and columns 106 in layer 302(2)). Layer 302 with channels 108 therein may be referred to herein as "channel layer" merely to distinguish it from other layers that do not have channels therein. Note that channel layer 302 may also comprise columns 106 embedded in, or otherwise contacting, channels 108 in some embodiments. Likewise, layer 302 with columns 106 may be referred to herein as "column layer" merely to distinguish it from other layers that have different elements therein. Channels 108 in any one channel layer 302 (e.g., channels 108A in layer 302(1), or channels 108B in layer 302(3)) are mutually parallel to each other. Channels 108 in alternating channel layers 302 (e.g., channels 108A in layer 302(1) and channels 108B in layer 302(3)) are mutually orthogonal to each other. Columns 106 in column layer 302, namely layer 302(2) may contact channels 108A and 108B in channel layers 302(1) and 302(3) respectively. In many embodiments, at least a subset of columns 106 extend between the two mutually orthogonal channels 108 in alternating channel layers 302.

In the example embodiment shown, routing layers 304 are located between alternating layers 302. For example, routing layer 304(1) is located between layers 302(1) and 302(2); routing layer 304(2) is located between layers 302(2) and 302(3). In some embodiments, conductive traces 112 in a particular routing layer 304 may be thinner than the thickness of the routing layer 304 such that dielectric material 110 is between conductive traces 112 and adjacent layers of reinforcement structure 104 (i.e., conductive traces 112 may not contact reinforcement structure 104). In some embodiments (not shown in the figure), routing layer 304 may be located within one of layers 302, for example, in layer 302(2) such that dielectric material 110 separates conductive traces 112 from channels 108. In some embodiments, channels 108 may not be as thick as the respective channel layer 302 it is embedded in, and consequently, dielectric material 110 may fill any gaps between such channels 108 and conductive traces 112 in adjacent routing layer 304.

Conductive vias 114 may extend through one or more of layers 302 and contact conductive traces 112 in routing layers 304. For example, conductive vias 114 may extend through layer 302(1) to contact conductive traces 112 in routing layer 304(1). Some conductive vias 114 through layer 302(1) may terminate at adjacent routing layer 304(1); some conductive vias 114 may extend through multiple layers (e.g., routing layer 304(1) and layer 302(2)) to terminate at another non-adjacent routing layer 304(2). Conductive vias 114 may be dispersed in dielectric material 110 so as not to intersect with channels 108 or columns 106 in some embodiments. In other embodiments, conductive vias may be disposed through channels 108.

Note that conductive traces 112 shown in routing layers 304 are merely for illustrative purposes and are not intended to be any sort of limitation. The relative thicknesses of conductive traces 112 and columns 106 (and/or channels 108) are also not drawn to scale and are not meant to be construed as limitations. In some embodiments, the thickness of columns 106, and widths of channels 108 may be of the same order of magnitude as widths of conductive traces 112; in other embodiments, channels 108 may be significantly wider than conductive traces 112. In some embodiments, channels 108 may be of uniform width, and spaced uniformly apart; for example, channels 108 may be 1 millimeter wide and spaced 5 millimeters apart. In other embodiments, channels 108 may be of varying widths and may not be spaced uniformly apart; for example, the width of channels 108 may range between 3%-6% of the width of package substrate 102; and spacing between adjacent channels 108 may range between 3 millimeters and 10 millimeters. Layers 302 may range in thickness typically between 20 micrometers and 40-50 micrometers. In some embodiments, layers 302 may range in thickness between 20 micrometers and 80 micrometers.

Figure 4:
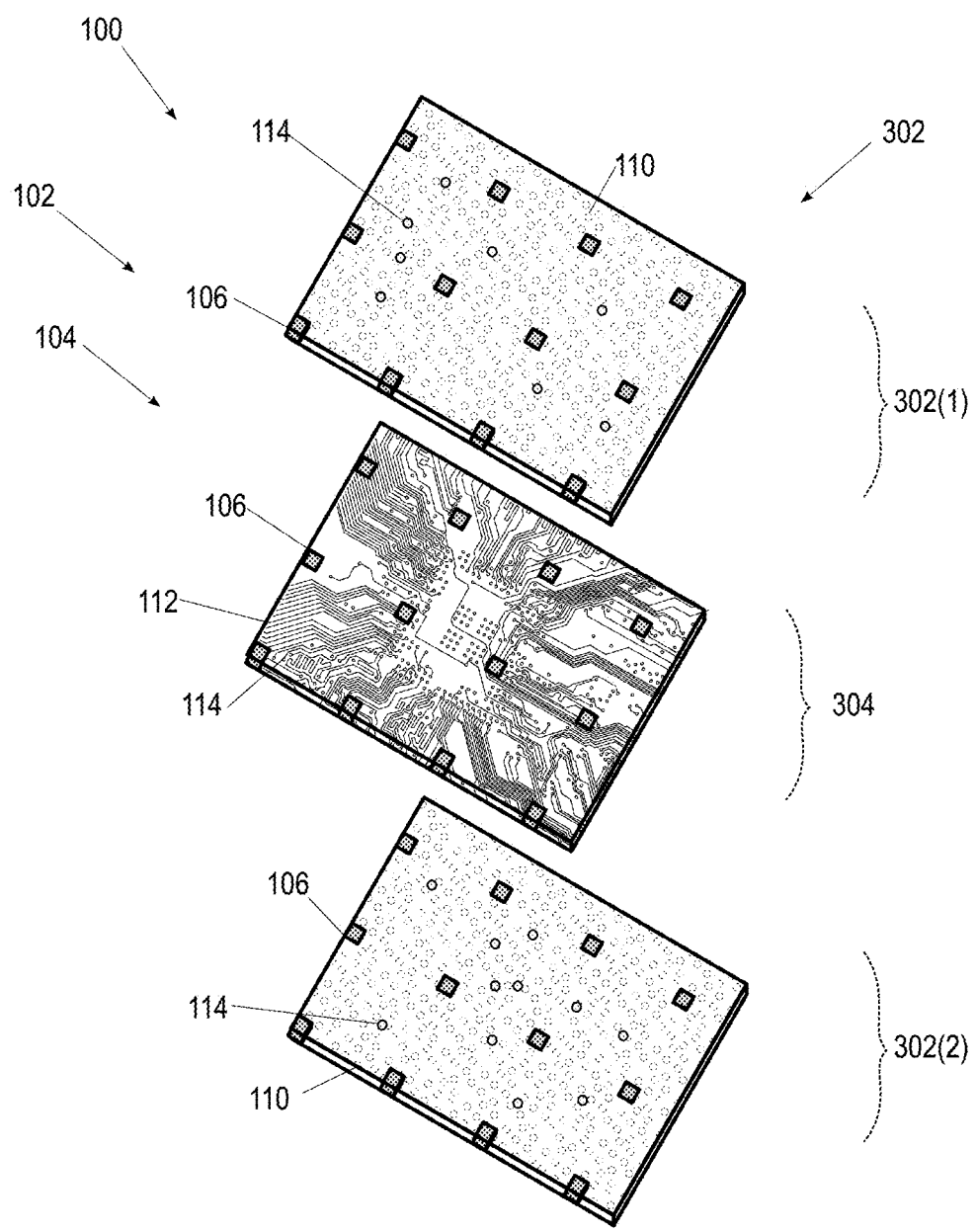
FIG. 4 is an exploded perspective view of a portion of yet another example microelectronic assembly according to some embodiments of the present disclosure.

FIG. 4 is an exploded perspective view of a portion of yet another example microelectronic assembly 100 according to some embodiments of the present disclosure. The figure may represent at least two different embodiments. In a first embodiment, layers labeled 302(1) and 302(2) may be at two distinct levels in reinforcement structure 104 (and/or package substrate 102). The thickness of each one of layers 302(1) and 302(2) may range between 20 micrometers and 40 micrometers. Routing layer 304 comprising conductive traces 112 may be disposed between layers 302(1) and 302(2). In the embodiment, channels 108 may be absent in these layers (but may be present in other layers not shown, for example, as in FIG. 2). Columns 106 may extend through all three layers shown, i.e., 302(1), 304, and 302(2) (and also through other layers not shown, for example, through an entire thickness of package substrate 102).

In an alternative embodiment, layers labeled 302(1) and 302(2) may comprise portions of a single layer 302 in reinforcement structure 104 (and/or package substrate 102). Routing layer 304 comprising conductive traces 112 may be disposed within such layer 302. The total thickness of layer 302, including routing layer 304 may range between 20 micrometers and 40 micrometers in such embodiments.

Figure 5:
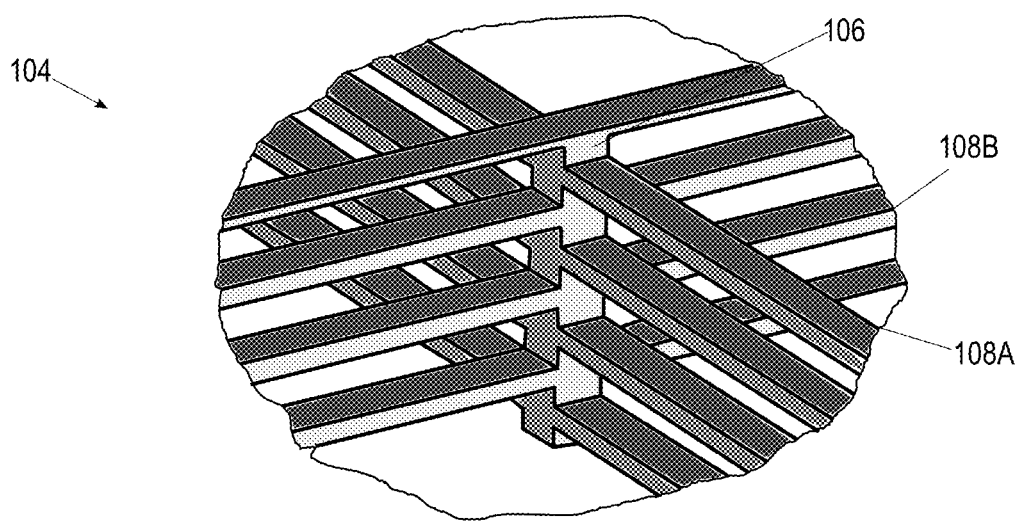
FIG. 5 is a simplified perspective view of details of an example reinforcement structure in some embodiments of the microelectronic assembly.

FIG. 5 is a simplified perspective view of details of an example reinforcement structure 104 in some embodiments of the microelectronic assembly 100. Mutually orthogonal channels 108A and 108B in alternating layers may be coupled to columns 106. Columns 106 extend in a direction perpendicular to mutually orthogonal channels 108A and 108B, for example, through the thickness of package substrate 102. The space between the members of reinforcement structure may be filled by dielectric material 110, conductive traces 112 and conductive vias 114 as appropriate.

Figure 6:
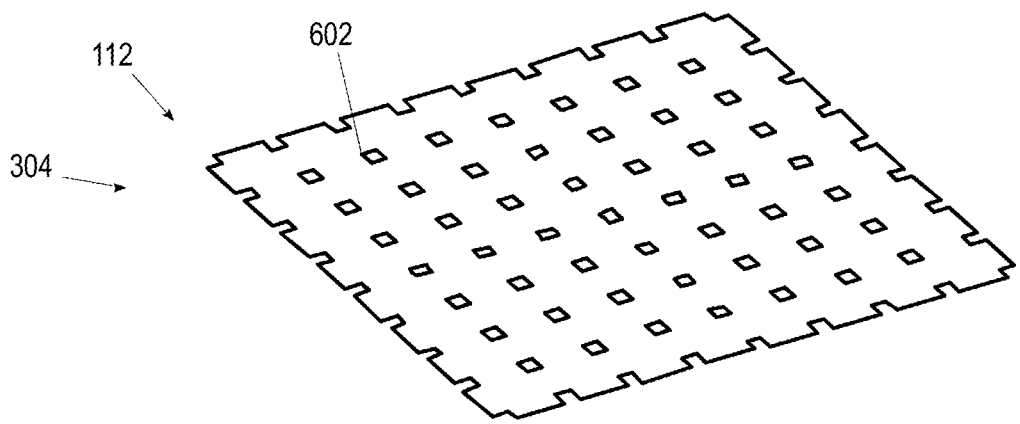
FIG. 6 is a simplified perspective view of details of an example embodiment of the microelectronic assembly.

FIG. 6 is a simplified perspective view of details of an example embodiment of the microelectronic assembly 100. Conductive traces 112 may comprise power and/or ground planes in some embodiments as shown in the figure. The conductive planes may extend throughout a particular one of routing layers 304 of package substrate 102. The particular one of conductive traces 112 comprising a power plane as shown in the figure may comprise holes 602 for column 106. Each hole 602 corresponds to a different one of columns 106 of reinforcement structure 104.

Figure 7:
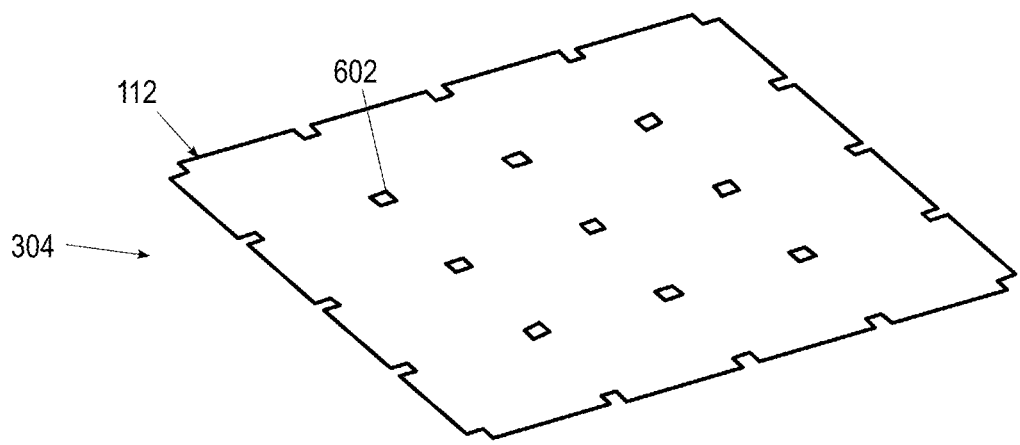
FIG. 7 is a simplified perspective view of details of an example embodiment of the microelectronic assembly.

FIG. 7 is a simplified perspective view of details of an example embodiment of the microelectronic assembly. Conductive trace 112 shown in the figure comprises a power plane substantially similar to the one in the previous figure, except that a pitch between adjacent ones of holes 602 is larger to accommodate columns 106 spaced farther apart. In many embodiments, a pitch between adjacent ones of columns 106 (and corresponding holes 602 in routing layer 304) may be between 3 millimeters and 10 millimeters.

Figure 8:
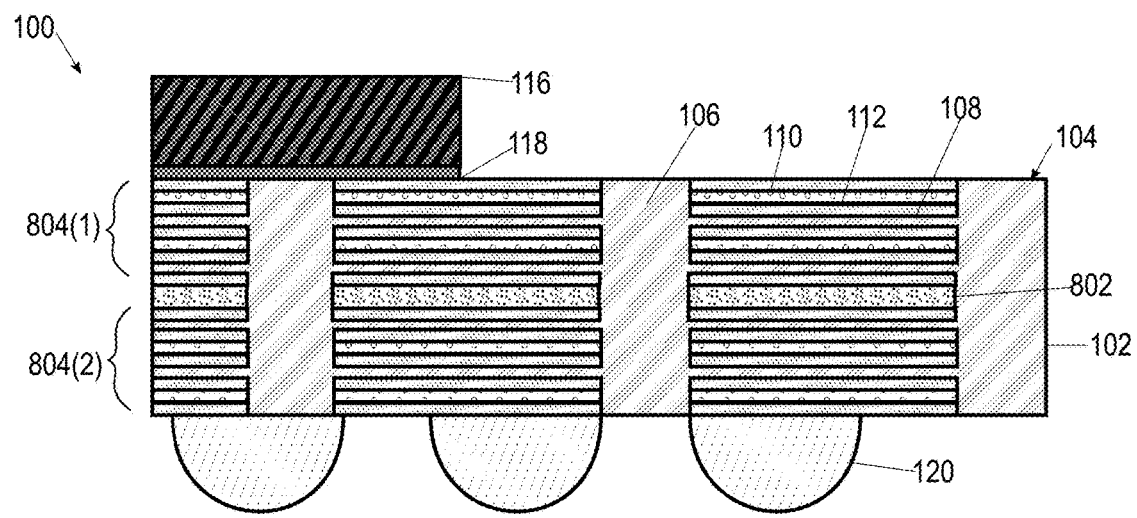
FIG. 8 is a simplified cross-sectional view of a portion of yet another example microelectronic assembly according to some embodiments of the present disclosure.

FIG. 8 is a simplified cross-sectional view of a portion of yet another example microelectronic assembly 100 according to some embodiments of the present disclosure. Package substrate 102 may comprise a core 802. Plurality of layers 302 and 304 on one side of core 802 (e.g., proximate to interconnects 118) may comprise a subsection 804(1) of package substrate 102; likewise, plurality of layers 302 and 304 on an opposing side of core 802 (e.g., proximate to interconnects 120) may comprise another subsection 804(2) of package substrate 102. Columns 106 may pass through core 802 in some embodiments. Core 802 may range in thickness between 100 micrometers and 2000 micrometers in different embodiments. Core 802 may comprise fiber-reinforced epoxy or other organic dielectric materials having a higher elastic modulus and lower CTE than dielectric material 110 (e.g., epoxy, phenolic or polyimide resin reinforced with fillers of glass cloth, aramid, nylon). Examples of some commercially available core materials are Hitachi's E700G/E705G/E795G series materials.

Figure 9:
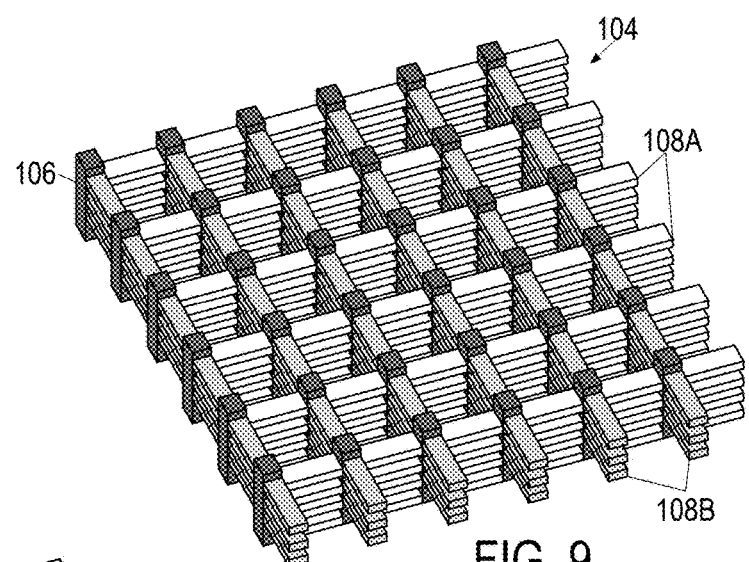
FIG. 9 is a simplified perspective view of details of an example reinforcement structure in some embodiments of the microelectronic assembly.

FIG. 9 is a simplified perspective view of details of an example reinforcement structure 104 in some embodiments of microelectronic assembly 100. Channels 108A and 108B may be located in separate, alternating layers and may be mutually orthogonal to each other, whereas channels 108 in the same layer may be mutually parallel to each other (and also parallel to the opposing faces of package substrate 102 coupled to IC die 116 and a PCB). Columns 106 extending through the thickness of package substrate 102 may contact channels 108A and 108B in the alternating layers. In some embodiments, the portion of reinforcement structure 104 shown in the figure may extend throughout package substrate 102. In other embodiments in which package substrate 102 comprises core 802, the portion of reinforcement structure 104 shown in the figure may extend throughout only subsection 804 of package substrate 102 on one side of core 802.

FIG. 10 is a simplified perspective view of details of an example reinforcement structure 104 in some embodiments of microelectronic assembly 100. Reinforcement structure 104 shown in the figure is substantially similar to the embodiment of the previous figure, except that core 802 is present. Reinforcement structure 104 may extend on either side of core 802 symmetrically in some embodiments (e.g., with equal number of layers 302 on either side of core 802) or asymmetrically in other embodiments (e.g., with unequal number of layers 302 on either side of core 802).

Figure 11:
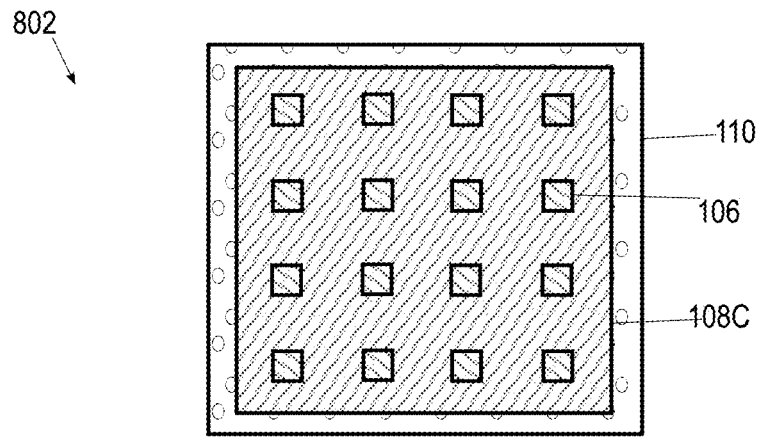
FIG. 11 is a simplified top view of details of an example core in some embodiments of the microelectronic assembly.

FIG. 11 is a simplified top view of details of an example core 802 in some embodiments of microelectronic assembly 100. Core 802 in some embodiments may comprise a plate 108C of the same material as reinforcement structure 104 embedded in dielectric material 110. Columns 106 may pass through plate 108C to extend on either side of core 802.

Figure 12:
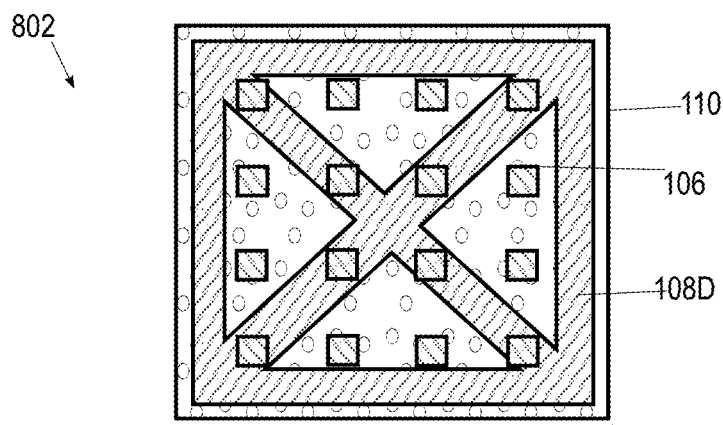
FIG. 12 is a simplified top view of details of another example core in some embodiments of the microelectronic assembly.

FIG. 12 is a simplified top view of details of another example core 802 in some embodiments of microelectronic assembly 100. Core 802 in some embodiments may comprise a cutout shape 108D, for example, a rectangular ring embedded in dielectric material 110, the corners of the rectangular ring being coupled by diagonal channels for added strength. Columns 106 may pass through cutout shape 108D to extend on either side of core 802. Cutout shape 108D may comprise the same material as reinforcement structure 104.

Figure 13:
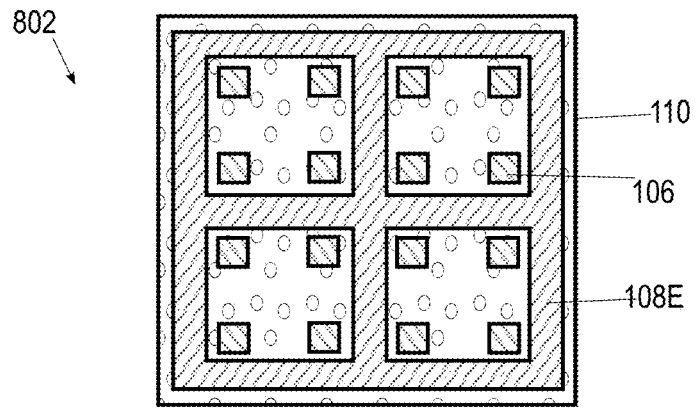
FIG. 13 is a simplified top view of details of yet another example core in some embodiments of the microelectronic assembly.

FIG. 13 is a simplified top view of details of yet another example core 802 in some embodiments of the microelectronic assembly. In some embodiments, core 802 comprises a grid 108E embedded in dielectric material 110 in a plane of core 802, grid 108E comprising mutually perpendicular channels within a rectangular ring. The rectangular ring may be along a periphery of core 802 in the same plane. Columns 106 may pass through grid 108E to extend on either side of core 802. Grid 108E may comprise the same material as reinforcement structure 104.

In various embodiments, any of the features discussed with reference to any of FIGS. 1-13 herein may be combined with any other features to form a package with one or more IC dies as described herein, for example, to form a modified microelectronic assembly 100. Some such combinations are described above, but, in various embodiments, further combinations and modifications are possible.

Example Devices and Components

Figure 14:
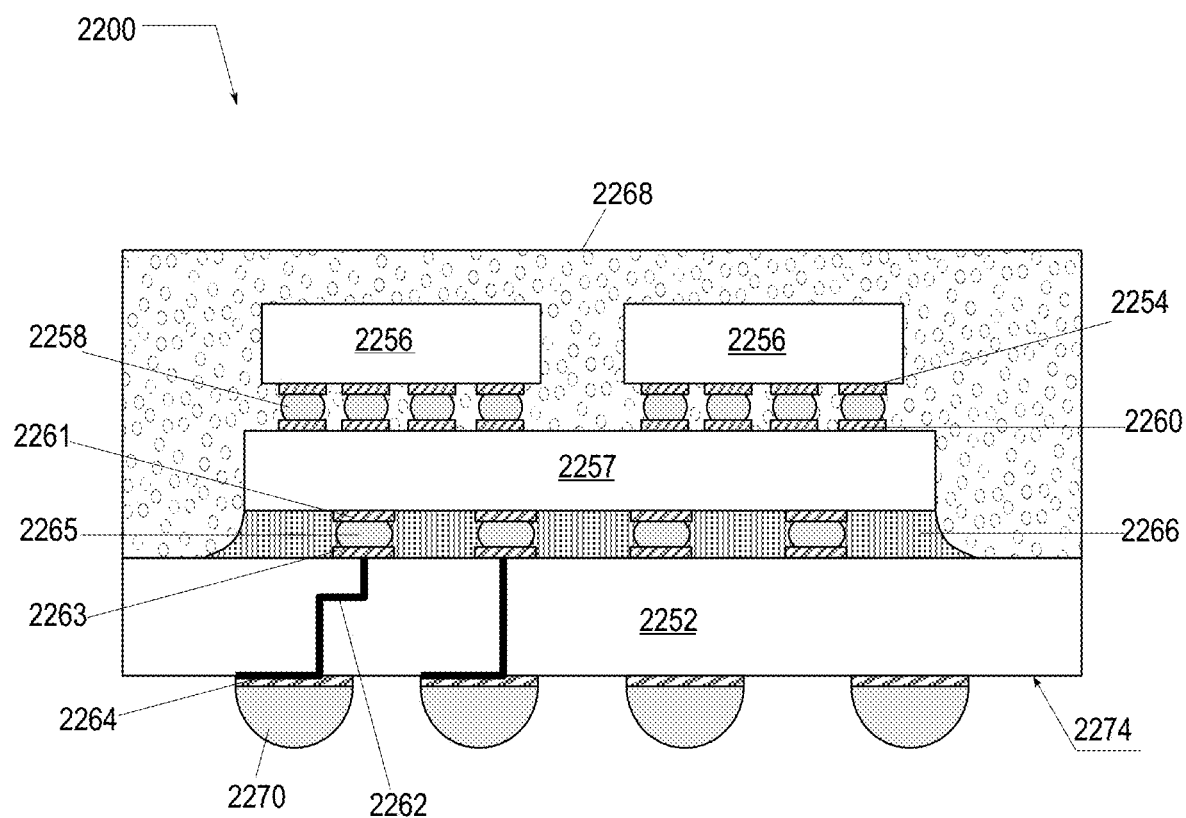
FIG. 14 is a cross-sectional view of a device package that includes one or more microelectronic assemblies in accordance with any of the embodiments disclosed herein.
Figure 15:
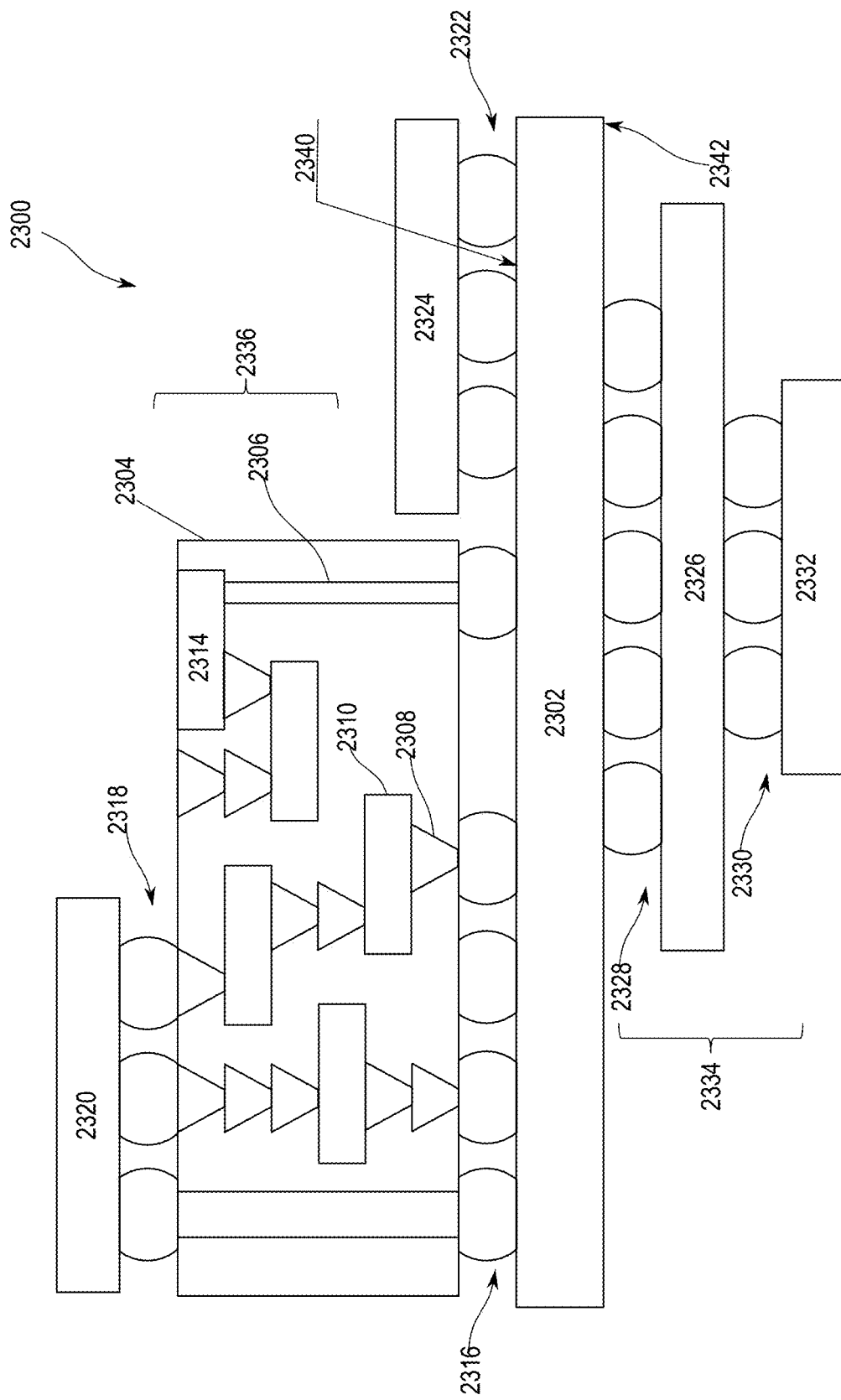
FIG. 15 is a cross-sectional side view of a device assembly that includes one or more microelectronic assemblies in accordance with any of the embodiments disclosed herein.
Figure 16:
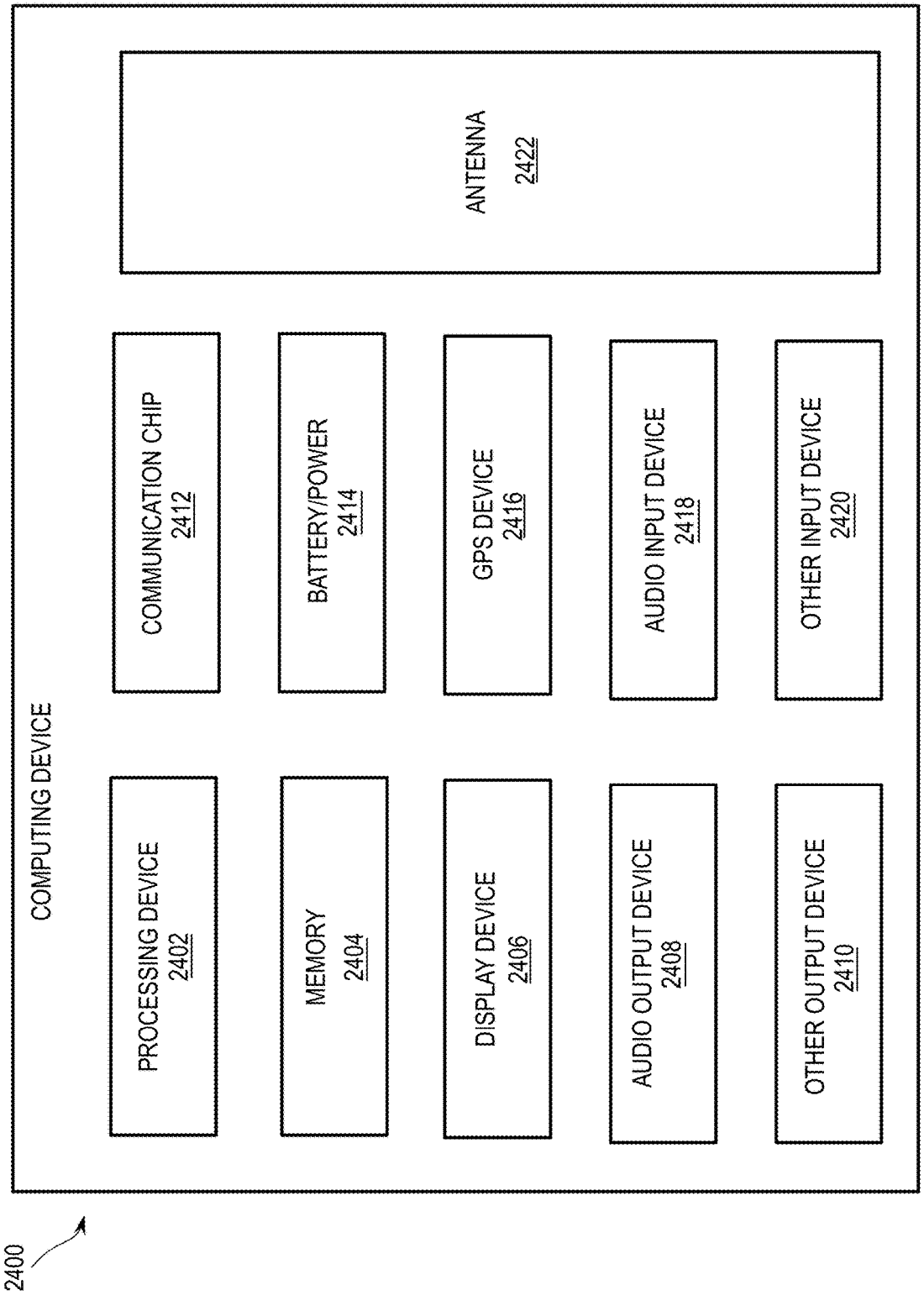
FIG. 16 is a block diagram of an example computing device that includes one or more microelectronic assemblies in accordance with any of the embodiments disclosed herein.

The packages disclosed herein, e.g., any of the embodiments shown in FIGS. 1-13 or any further embodiments described herein, may be included in any suitable electronic component. FIGS. 14-16 illustrate various examples of packages, assemblies, and devices that may be used with or include any of the IC packages as disclosed herein.

FIG. 14 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 15.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 15 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 14.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 14. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio-frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 16 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 14). In yet another example, any one or more of the components of computing device 2400 may include an IC device assembly 2300 (e.g., as shown in FIG. 15).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio-frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a package substrate (e.g., 102, FIG. 3), comprising: a first layer (e.g., 302(1)) comprising a first plurality of mutually parallel channels (e.g., 108A) of a first material; a second layer (e.g., 302(2)) comprising columns (e.g., 106) of the first material; and a third layer (e.g., 302(3)) comprising a second plurality of mutually parallel channels (e.g., 108B) of the first material, the second plurality of mutually parallel channels being orthogonal to the first plurality of mutually parallel channels, wherein: the second layer is between the first layer and the third layer, at least some columns extend between and contact the first plurality of mutually parallel channels and the second plurality of mutually parallel channels, and at least a portion of the first layer, the second layer and the third layer comprises a second material (e.g., 110) different from the first material.

Example 2 provides the package substrate of example 1, wherein each of the first layer, the second layer and the third layer is between 20 micrometers and 80 micrometers thick.

Example 3 provides the package substrate of any one of examples 1-2 (e.g., FIG. 4), further comprising conductive traces (e.g., 112) and conductive vias (e.g., 114), wherein: the conductive traces are in the second layer (e.g., in 304), the conductive vias are through at least the first layer (e.g., 302(1)), and the conductive vias are coupled to the conductive traces.

Example 4 provides the package substrate of any one of examples 1-2 (e.g., FIG. 3), further comprising conductive traces and conductive vias, wherein: the conductive traces are between the first layer and the second layer (e.g., in 304(1)), the conductive vias are through at least the first layer (e.g., 302(1)), and the conductive vias are coupled to the conductive traces.

Example 5 provides the package substrate of example 4, wherein: the conductive traces are further between the second layer and the third layer (e.g., 304(2)), the conductive vias are further through the second layer (e.g., 302(2)), and the conductive vias are coupled to the conductive traces.

Example 6 provides the package substrate of any one of examples 1-5, wherein the second material comprises prepreg.

Example 7 provides the package substrate of any one of examples 1-6, wherein the first material has a lower CTE than the second material.

Example 8 provides the package substrate of any one of examples 1-7, wherein the first material has a similar CTE as the second material.

Example 9 provides the package substrate of any one of examples 1-8, wherein the first material has a higher elastic modulus than the second material.

Example 10 provides the package substrate of any one of examples 1-9, wherein the first material comprises a selection from fiber reinforced glass, glass-ceramic, copper, titanium, platinum, steel, aluminum, ceramic, and rigid polymeric material.

Example 11 provides the package substrate of any one of examples 1-9, wherein: the first material comprises conductive metal alloy, and a portion of the first material is electrically coupled to a ground connection.

Example 12 provides the package substrate of any one of examples 1-11, further comprising a fourth layer comprising conductive traces, wherein: the first layer is between the fourth layer and the second layer, and the fourth layer is coupled to an IC die.

Example 13 provides the package substrate of example 12, wherein the conductive traces in the fourth layer are in contact with interconnects (e.g., 118) coupled to the IC die.

Example 14 provides the package substrate of any one of examples 12-13, further comprising a fifth layer comprising conductive traces, wherein: the third layer is between the second layer and the fifth layer, and the fifth layer is coupled to a PCB.

Example 15 provides the package substrate of example 14, wherein the conductive traces in the fifth layer are in contact with interconnects (e.g., 120) coupled to the PCB.

Example 16 provides the package substrate of any one of examples 1-15 (e.g., FIG. 8), wherein the first layer, the second layer and the third layer together comprise a subsection of the package substrate (e.g., 804(1), 804(2)), and the package substrate further comprises a plurality of the subsections stacked one over the other.

Example 17 provides the package substrate of any one of examples 1-15, wherein the first layer, the second layer and the third layer together comprise a subsection of the package substrate, and the package substrate further comprises: a core (e.g., 802) having a first side and an opposing second side, the first side in contact with the subsection (e.g., 804(1)); and another one of the subsection (e.g., 804(2)) in contact with the second side of the core.

Example 18 provides the package substrate of example 17, further comprising: a plurality of the subsections on the first side of the core; and another plurality of the subsections on the second side of the core.

Example 19 provides the package substrate of any one of examples 17-18, wherein columns extend through a thickness of the core (e.g., FIG. 10).

Example 20 provides the package substrate of example 19, wherein a thickness of the columns is proportional to the thickness of the core.

Example 21 provides the package substrate of any one of examples 1-20, wherein the channels are spaced closer together than in another package substrate having higher bending stiffness.

Example 22 provides the package substrate of any one of examples 1-21, wherein the channels are wider than in another package substrate having higher bending stiffness.

Example 23 provides a package substrate (e.g., 102), comprising: routing layers (e.g., 304) comprising conductive traces (e.g., 112) in a dielectric material (e.g., 110); and a reinforcement structure (e.g., 104) comprising channels (e.g., 108) and columns (e.g., 106) of a rigid material, wherein: the channels and the columns are arranged in alternating layers, each routing layer is between two alternating layers of channels, and the rigid material has a higher elastic modulus than the dielectric material.

Example 24 provides the package substrate of example 23, wherein: channels in any one layer of channels are mutually parallel, channels in alternating layers of channels are mutually orthogonal, and at least some columns between alternating layers of channels contact the mutually orthogonal channels.

Example 25 provides the package substrate of any one of examples 23-24, wherein the reinforcement structure is embedded in the dielectric material such that a volume between and around the channels and the columns comprise the dielectric material.

Example 26 provides the package substrate of any one of examples 23-25, wherein the dielectric material comprises prepreg.

Example 27 provides the package substrate of any one of examples 23-26, wherein the rigid material has a lower CTE than the dielectric material.

Example 28 provides the package substrate of any one of examples 23-27, wherein the conductive traces are routed around the columns.

Example 29 provides the package substrate of any one of examples 23-28, further comprising conductive vias (e.g., 114) through the dielectric material, the conductive vias in contact with the conductive traces of the routing layers.

Example 30 provides the package substrate of example 29, wherein the conductive vias are routed around the channels and the columns.

Example 31 provides the package substrate of any one of examples 23-30, further comprising a core (e.g., 802) within the package substrate.

Example 32 provides the package substrate of any one of examples 23-31, wherein the reinforcement structure extends from a first face of the package substrate to a second, opposing face of the package substrate.

Example 33 provides a microelectronic assembly (e.g., 100), comprising: an IC die (e.g., 116); and a package substrate (e.g., 102) coupled to the IC die, the package substrate comprising: routing layers (e.g., 304) comprising conductive traces (e.g., 112) in a first material; and a reinforcement structure (e.g., 104) in the first material, the reinforcement structure of a second material different from the first material, the reinforcement structure comprising: a plurality of layers (e.g., 302) of channels (e.g., 108), the channels being mutually parallel in any one layer and mutually orthogonal in alternating layers; and columns (e.g., 106) between the alternating layers, at least some columns extending between and in contact with mutually orthogonal channels in the alternating layers.

Example 34 provides the microelectronic assembly of example 33, wherein the second material has a higher elastic modulus than the first material.

Example 35 provides the microelectronic assembly of any one of examples 33-34, wherein: the first material comprises prepreg, and the second material has a lower CTE than the first material.

Example 36 provides the microelectronic assembly of any one of examples 33-35, wherein the package substrate further comprises a core (e.g., 802), with the columns of the reinforcement structure extending through the core.

Example 37 provides the microelectronic assembly of example 36, wherein a thickness of each column is proportional to a thickness of the core.

Example 38 provides the microelectronic assembly of any one of examples 36-37, wherein the core comprises fiber-reinforced epoxy.

Example 39 provides the microelectronic assembly of any one of examples 33-38, wherein the package substrate further comprises conductive vias (e.g., 114) coupling the conductive traces of different routing layers.

Example 40 provides the microelectronic assembly of example 39, wherein the conductive vias do not intersect with the channels.

Example 41 provides the microelectronic assembly of any one of examples 33-40 (e.g., FIG. 3), wherein the routing layers are between the alternating layers of channels of the reinforcement structure.

Example 42 provides the microelectronic assembly of any one of examples 33-41, wherein the channels are wider and closer than in another package substrate with lesser bending stiffness.

Example 43 provides the microelectronic assembly of any one of examples 33-42, wherein at least some columns are located around the conductive traces in the routing layer.

Example 44 provides the microelectronic assembly of any one of examples 33-43, wherein cross-sections of the channels and the columns are one of rectangles, squares, and circles.

Example 45 provides the microelectronic assembly of any one of examples 33-44, further comprising a PCB coupled to the package substrate on a side opposite to the IC die.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A package substrate, comprising:
a first layer comprising a first plurality of mutually parallel channels of a first material;
a second layer comprising columns of the first material;
a third layer comprising a second plurality of mutually parallel channels of the first material, the second plurality of mutually parallel channels being orthogonal to the first plurality of mutually parallel channels; and
a conductive trace in the second layer,
wherein:
the second layer is between the first layer and the third layer,
at least some columns extend between and contact the first plurality of mutually parallel channels and the second plurality of mutually parallel channels, at least a portion of the first layer, the second layer and the third layer comprises a second material different from the first material, the first material has a higher elastic modulus than the second material, and the second material is between the conductive trace and a channel of the first plurality of mutually parallel channels.

2. The package substrate of claim 1, further comprising conductive traces and conductive vias, wherein:

the conductive traces are in the second layer, the conductive vias are through at least the first layer, and the conductive vias are coupled to the conductive traces.

3. The package substrate of claim 1, further comprising conductive traces and conductive vias, wherein:

the conductive traces are between the first layer and the second layer, the conductive vias are through at least the first layer, and the conductive vias are coupled to the conductive traces.

4. The package substrate of claim 1, wherein the first layer, the second layer and the third layer together comprise a subsection of the package substrate, and the package substrate further comprises a plurality of the subsections stacked one over the other.

5. The package substrate of claim 1, wherein the first layer, the second layer and the third layer together comprise a subsection of the package substrate, and the package substrate further comprises:

a core having a first side and an opposing second side, the first side in contact with the subsection; and another one of the subsection in contact with the second side of the core.

6. The package substrate of claim 1, further comprising: conductive contacts to couple with an IC die, wherein:

the columns have a greater density in a first region closer to the conductive contacts than in a second region farther from the conductive contacts.

7. The package substrate of claim 1, further comprising: a conductive via extending through the channel.

8. The package substrate of claim 1, wherein:

the channel has a width that is greater than the conductive trace.

9. A package substrate, comprising:

a first layer comprising a first plurality of mutually parallel channels of a first material;

a second layer comprising columns of the first material;

a third layer comprising a second plurality of mutually parallel channels of the first material, the second plurality of mutually parallel channels being orthogonal to the first plurality of mutually parallel channels; and a conductive via in the second layer, wherein:

the second layer is between the first layer and the third layer, at least some columns extend between and contact the first plurality of mutually parallel channels and the second plurality of mutually parallel channels, at least a portion of the first layer, the second layer and the third layer comprises a second material different from the first material, the first material has a higher elastic modulus than the second material, and the second material is between the conductive via and one of the columns.

10. The package substrate of claim 9, further comprising conductive traces and conductive vias, wherein:

the conductive traces are in the second layer, the conductive vias are through at least the first layer, and the conductive vias are coupled to the conductive traces.

11. The package substrate of claim 9, further comprising conductive traces and conductive vias, wherein:

the conductive traces are between the first layer and the second layer, the conductive vias are through at least the first layer, and the conductive vias are coupled to the conductive traces.

12. The package substrate of claim 9, wherein the first layer, the second layer and the third layer together comprise a subsection of the package substrate, and the package substrate further comprises a plurality of the subsections stacked one over the other.

13. The package substrate of claim 9, further comprising: conductive contacts to couple with an IC die, wherein:

the columns have a greater density in a first region closer to the conductive contacts than in a second region farther from the conductive contacts.

14. The package substrate of claim 9, wherein:

the conductive via extends through the channel.

15. The package substrate of claim 9, further comprising: a conductive trace in the second layer, wherein: the channel has a width that is greater than the conductive trace.

16. The package substrate of claim 9, wherein:

a cross-section of the channel is one of a rectangle, square, and circle.

* * * * *